United States Patent
Kurashima et al.

(10) Patent No.: US 6,790,769 B2
(45) Date of Patent: Sep. 14, 2004

(54) CMP SLURRY AND METHOD OF MANUFACTURING SEMICONDUCTOR DEVICE

(75) Inventors: Nobuyuki Kurashima, Yokohama (JP); Gaku Minamihaba, Kawasaki (JP); Hiroyuki Yano, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 10/269,993

(22) Filed: Oct. 15, 2002

(65) Prior Publication Data

US 2003/0100186 A1 May 29, 2003

(30) Foreign Application Priority Data

Nov. 28, 2001 (JP) ........................................ 2001-362923

(51) Int. Cl.⁷ .......................................... H01L 21/4763
(52) U.S. Cl. ...................... 438/633; 438/643; 438/653; 438/687; 438/692; 438/693
(58) Field of Search ................................ 438/633, 643, 438/653, 687, 692, 693

(56) References Cited

U.S. PATENT DOCUMENTS 6,352,595 B1 * 3/2002 Svirchevski et al. ........... 134/3

FOREIGN PATENT DOCUMENTS

JP          2001-57367         2/2001

* cited by examiner

Primary Examiner—Hsien Ming Lee
(74) Attorney, Agent, or Firm—Finnegan, Henderson, Farabow, Garrett & Dunner, L.L.P.

(57) ABSTRACT

A method of manufacturing a semiconductor device includes forming an insulation film having a recess above a semiconductor substrate, depositing a conductive film on the insulation film and filming conductive film in the recess, and polishing the conductive film by a CMP process using CMP slurry in order to selectively leave the conductive film in the recess, the CMP slurry including a polishing component and a restoring component, thereby reducing a scratch formed on at least one of the insulation film and the conductive film by causing the scratch to be filled.

8 Claims, 2 Drawing Sheets

CMP SLURRY AND METHOD OF MANUFACTURING SEMICONDUCTOR DEVICE

CROSS-REFERENCE TO RELATED APPLICATIONS

This application is based upon and claims the benefit of priority from the prior Japanese Patent Application No. 2001-362923, filed Nov. 28, 2001, the entire contents of which are incorporated herein by reference.

BACKGROUND OF THE INVENTION

1. Field of the Invention

The present invention relates to slurry for CMP (Chemical Mechanical Polishing) and a method of manufacturing a semiconductor device. More specifically, the invention relates to CMP slurry capable of reducing scratches on a region to be polished during the CMP process and a method of manufacturing a semiconductor device.

2. Description of the Related Art

Various microfabrication technologies have recently been developed in accordance with high packing density of semiconductor devices and miniaturization of semiconductor elements. Of the microfabrication technologies, a CMP technology is indispensable to formation of damascene interconnection.

The current metal damascene interconnection process requires CMP whose polishing speed is high and which causes few erosions (hollows made by polishing) and scratches (flaws and cracks). The reason is as follows. The polishing speed should be increased to enhance throughput and the erosions and scratches of interconnections and interlayer insulators should be reduced to form a high-performance interconnection.

The characteristics of CMP depend chiefly upon slurry and a polishing pad. The polishing pad needs to be hardened to a certain degree in order to reduce erosions. With a polishing pad that is softer than a hard pad (IC1000-Pad) that is currently on the market by Rodel, the reduction in erosions is considered to be difficult using whatever slurry.

Though the hard pad can reduce erosions, a number of scratches are caused on a metal interconnection and an insulation film in which the metal interconnection is filled, due to coarse particles such as abrasives contained in slurry and an aggregation of residues caused by polishing. The scratches cause a film to peel off.

Under present circumstances, there is a tradeoff relationship between a reduction in erosions and a reduction in scratches. Most of scratches on an insulation film are made by abrasives, while most of scratches on a metal interconnection are made by an aggregation caused by a deteriorated layer or a protection film (e.g., a metal oxide or complex compound) that is formed on the surface of the interconnection during polishing. The deteriorate layer comes off the outer edge of the substrate.

In the prior art CMP described above, the hard pad can reduce the erosions but the scratches are difficult to reduce at the same. It has been therefore desired that CMP slurry capable of virtually reducing scratches is accomplished and so is a method of manufacturing a semiconductor device using the CMP slurry.

BRIEF SUMMARY OF THE INVENTION

CMP slurry according to a first aspect of the present invention, comprises:

a polishing component to polish a region to be polished, which includes at least one of a sub-region made of insulative material and a sub-region made of conductive material; and a restoring component to reduce a scratch of the region to be polished.

A method of manufacturing a semiconductor device according to a second aspect of the present invention, comprises:

forming an insulation film having a recess above a semiconductor substrate;

depositing a conductive film on the insulation film and filling the conductive film in the recess; and polishing the conductive film by a CMP process using CMP slurry in order to selectively leave the conductive film in the recess, the CMP slurry comprising a polishing component and a restoring component to reduce a scratch formed on at least one of the insulation film and the conductive film.

A method of manufacturing a semiconductor device according to a third aspect of the present invention, comprises:

forming an insulation film having an interconnection groove above a semiconductor substrate;

depositing a first conductive film on the insulation film and covering an inner wall of the interconnection groove with the first conductive film;

depositing a second conductive film on the first conductive film and filling the second conductive film in the interconnection groove;

retreating the second conductive film until the first conductive film is exposed to selectively leave the second conductive film in the interconnection groove; and polishing the first conductive film by a CMP process using CMP slurry in order to selectively leave the first and second conductive films in the interconnection groove, the CMP slurry comprising a polishing component and a restoring component to reduce a scratch formed on at least one of the insulation film and the second conductive film.

DETAILED DESCRIPTION OF THE INVENTION

Figure 1A:
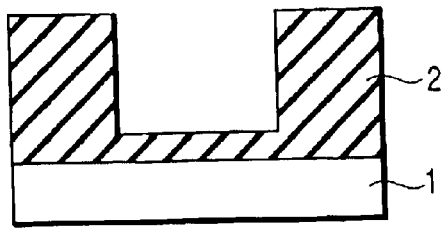
FIGS. 1A to 1D are step-by-step cross-sectional views showing a process of manufacturing a semiconductor device according to a first embodiment of the present invention.

Prior to the description of respective embodiments, the technical matters common to the embodiments will be summarized as follows.

According to the embodiments described later, the scratches caused during CMP are reduced by a restoring component contained in CMP slurry and can thus be reduced virtually. Consequently, both a reduction in erosions and a reduction in scratches are compatible with each other even by the use of a hard pad.

More specifically, the following materials and methods are adopted to reduce the scratches.

(1) The raw material of a restoring component to restore a region made of conductive material contains acid or salt including no conductive material. This acid or salt is inorganic acid or salt thereof such as phosphoric acid (a reducing agent of conductive material such as Cu) or organic acid or salt thereof. In this case, the acid or salt added to slurry serves as a restoring component to precipitate the conductive material on scratches from the slurry during polishing.

Salt including conductive material can be used as the raw material of a restoring component to restore a region made of conductive material. This salt is, for example, salt including copper (Cu) such as copper sulfate and copper chloride and salt including Al, Ti, Ta, V, Fe, W, or Ge. In this case, the scratches can be reduced by precipitating these conductive materials out of slurry. Both salt including conductive material and salt including no conductive material can be used in slurry.

(2) The component to restore a region made of insulative material contains silicon-based surfactant, superfine colloidal silica particle, cationic colloidal silica particle, hydrophobic colloidal silica particle, silicon oxide, silicon carbide, silicon nitride, a mixture of at least two of these oxides, or mixed crystal. These materials added to slurry serve as components to reduce scratches.

(3) An organic sulfur compound, for example, may be used as a promoter to promote the adhesion of the restoring component to the inner walls of scratches. The promoter is thioureaderivative, sulfopropyldisulphide, mercaptopropylsulfonic acid, or the like.

(4) When the conductive material is copper (Cu), a surfactant may be used as a retardant to retard the restoring component from adhering to the outside of each of scratches made on a region to be polished. The retardant is polyethyrene glycol, glycine, thioglycolic acid, or the like.

Embodiments of the present invention will now be described with reference to the accompanying drawings.

(First Embodiment)

FIGS. 1A to 1D are step-by-step cross-sectional views showing a process of manufacturing a semiconductor device according to a first embodiment of the present invention. In the first embodiment, there will be explained a touchup process (second polishing) of Cu damascene interconnection using slurry containing fine particles (diameter of primary particle<10 nm) as a restoring component.

Though the diameter of the primary particle of the restoring component is smaller than 10 nm, it has only to be 30 nm or smaller in general. This is because most scratches (flaws and cracks) have a dimension (width, depth) of 30 nm to 1000 nm.

Referring first to FIG. 1A, an interlayer insulation film 2 is deposited on a Si substrate 1 on which semiconductor elements (not shown) are formed and an interconnection groove is formed to a depth of 400 nm from the surface of the film 2. The interlayer insulation film 2 is made of material having a low relative dielectric constant of 3.0 or lower and chiefly including $SiO_2$. The material is an organic, hydrophobic one such as LKD (manufactured by JSR Corporation). Though the interlayer insulation film 2 made of such a material can reduce parasitic capacitance, it is brittle and delicate.

Figure 1B:
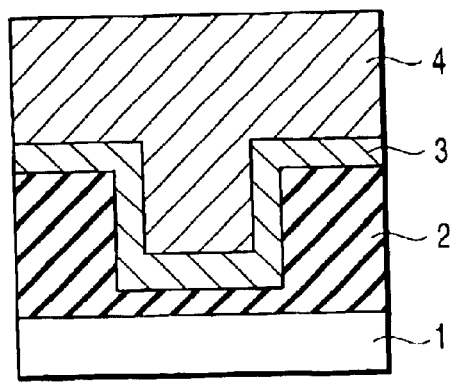

As shown in FIG. 1B, a TaN film 3 having a thickness of 10 nm and serving as a liner is deposited on the interlayer insulation film 2 so as to coat the inner wall of the interconnection groove and then a Cu film 4 having a thickness of 800 nm and serving as a Cu interconnection is deposited on the TaN film 3. The Cu film 4 is formed by sputtering and plating methods. More specifically, the Cu film 4 is formed by depositing a thin Cu film by the sputtering method and then depositing a thicker Cu film by the plating method using the thin Cu film as a seed.

Figure 1C:
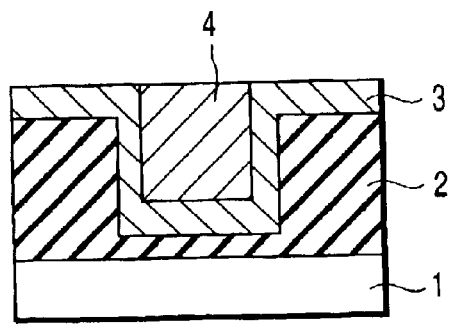

As illustrated in FIG. 1C, an undesired portion is removed from the Cu film 4 by a CMP process until the TaN film 3 is exposed to selectively leave the Cu film 4 in the interconnection groove (first polishing). Since the TaN film 3 serves as a stopper of CMP, the erosions and scratches of the interlayer insulation film 2 are reduced.

Slurry containing 1 wt % ammonium persulfate (oxidant), 0.5 wt % quinaldinic acid (oxidation inhibitor), 0.05 wt % anion surfactant, 1 wt % silica (diameter of primary particle is 50 nm), and KOH (pH adjuster to adjust pH to 9) is used. An IC1000 pad (manufactured by Rodel) is used as a polishing pad.

The polishing conditions are that a load is 300 $g/cm^2$, the number of revolutions of carriers is 102 rpm, the number of revolutions of a table is 100 rpm, the speed of supply of slurry is 200 cc per minute, and polishing time is 150 seconds.

Figure 1D:
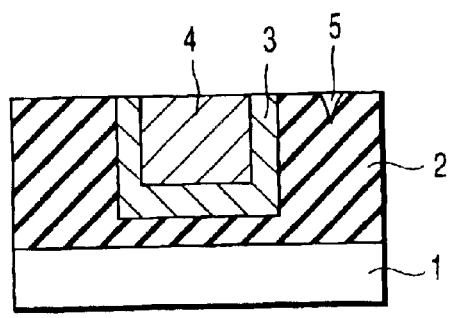

After that, as shown in FIG. 1D, undesired portions are removed from the TaN film 3 and Cu film 4 by the CMP process to selectively leave the TaN film 3 and Cu film 4 in the interconnection groove (second polishing), thus forming a Cu damascene interconnection.

The TaN film 3 is hard and the percentage thereof that occupies the surface after the second polishing is small. Thus, there is hardly any fear that the TaN film 3 will be scratched, and the scratch of the TaN film 3 can be ignored.

It is important to eliminate scratches caused on the Cu film (Cu interconnection) 4 and interlayer insulation film 2. However, it is almost impossible to reduce the scratches to zero. The scratches should therefore be reduced without causing any trouble about reliability and performance of interconnections. The reduction of scratches on the interlayer insulation film 2 will now be described.

The principal ingredient of the interlayer insulation film 2 is $SiO_2$. In order to fill $SiO_2$ of a restoring component in a region of the interlayer insulation film 2 including scratches, hydrophobic silica particles are used if the film 2 is made of an organic, hydrophobic material such as LKD (manufactured by JSR Corporation). Since both the interlayer insulation film and storing component are made of hydrophobic material, a great affinity is achieved and a physical combination is provided.

Whether the interlayer insulation film is hydrophobic or hydrophilic can be determined by measuring a contact angle to water. Specifically, the insulation film is hydrophobic when the contact angle is 90 degree or more, and is hydrophilic in the case under 90 degree. Whether the restoring component is hydrophobic or hydrophilic can also be determined by examining whether it is stably dispersed into pure water or not. Specifically, a restoring component not dispersed into pure water but precipitating is hydrophobic, and the other is hydrophilic.

As the above hydrophobic silica particles, there is silica (diameter of primary particle<10 nm) whose surface is treated to have a hydrophobic property, such as silica the surface of which adsorbs dodecylammonium of low-molecular material. Dodecylammonium has a hydrophobic group and a hydrophilic group, and silica has a hydrophilic group. If, therefore, silica is mixed into a dodecylammonium solution, the hydrophilic portion (negative) of the surface of the silica adsorbs the hydrophilic group (positive) of dodecylammonium. The silica is therefore treated such that its surface becomes hydrophobic.

In the first embodiment, therefore, dispersion water containing a 1 wt % particle the surface of which adsorbs the above dodecylammonium as a restoring component, 3 wt % silica (diameter of primary particle=30 nm) as a polishing particle (polishing component), and 0.05 wt % 7-hydroxy-5-methyl-1,3,4-triazaindolizine as an additive (Cu antioxidant), is used as slurry.

The polishing conditions are that an IC1000 pad (manufactured by Rodel) is used as a polishing pad (hard pad), a load is 300 g/cm$^2$, the number of revolutions of carriers is 52 rpm, the number of revolutions of a table is 50 rpm, the speed of supply of slurry is 200 cc per minute, and polishing time is 150 seconds.

If the second polishing is performed using the above slurry, silica 5 is filled in scratches caused on the surface of the interlayer insulation film 2 and thus the scratches are reduced, as shown in FIG. 1D, even though the hard pad is used. The scratches are therefore reduced virtually. The dodecylammonium that adsorbs on the silica 5 is also filled in the scratches and remains therein.

The scratches of the test sample so obtained were observed by a defect inspection apparatus (produced by KLA-Tencor). It was confirmed that the number of scratches made on the interlayer insulation film was conventionally 2,542 pcs. per 8-inch wafer and drastically reduced to 35 pcs. therefrom. It was also confirmed that the yield of interconnection per 8-inch wafer was 10% improved from 85% to 95%.

In the first embodiment, the scratches were reduced using a physical attraction caused between a restoring component having a hydrophobic property and an insulation film having a hydrophobic property. However, they can be done using an electrostatic attraction caused between a restoring component and an insulation film whose potentials have polarities opposite to each other. In other words, in order to collect $SiO_2$ on the interlayer insulation film 2 and reduce the scratches, a restoring component having a zeta potential whose polarity is opposite to that of the interlayer insulation film 2 under polishing and containing the principal ingredient of the film 2 can be used. When the interlayer insulation film 2 has a hydrophilic property, it is desirable to use a restoring component having a hydrophilic property in order to achieve a physical combination.

(Second Embodiment)

Figure 2A:
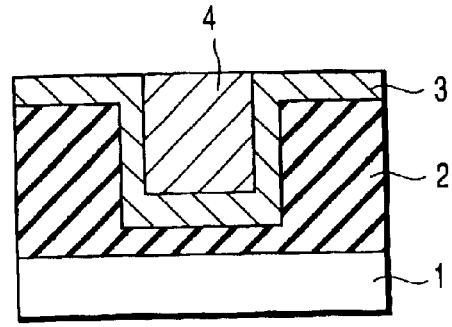
FIGS. 2A to 2C are step-by-step cross-sectional views showing a process of manufacturing a semiconductor device according to a second embodiment of the present invention.
Figure 2B:
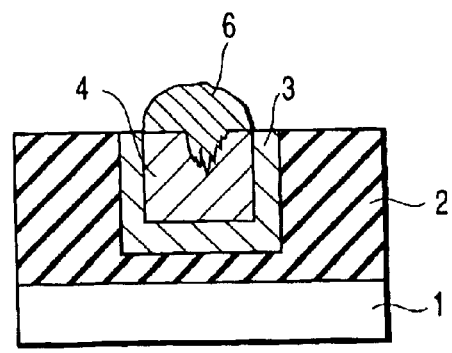
Figure 2C:
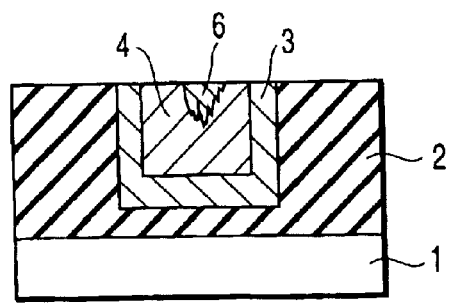

FIGS. 2A to 2C are step-by-step cross-sectional views showing a process of manufacturing a semiconductor device according to a second embodiment of the present invention. In the following embodiments, the same constituents as those of the first embodiment are denoted by the same reference numerals and their detailed descriptions are omitted.

The first embodiment is directed to a CMP process to reduce scratches caused on the interlayer insulation film 2, whereas the second embodiment is directed to a CMP process to reduce scratches caused on a Cu interconnection.

First, the steps (first polishing) shown in FIGS. 1A to 1C of the first embodiment are performed to obtain the structure illustrated in FIG. 2A.

Then, the second polishing is performed. In the second polishing, dispersion water containing 0.05 wt % phosphoric acid of inorganic-acid as a reducing agent (restoring component of Cu interconnection 4), 1 wt % silica (diameter of primary particle=50 nm) as a polishing particle (polishing component), and 0.05 wt % 7-hydroxy-5-methyl-1,3,4-triazaindolizine as an additive, is used as slurry. The polishing conditions are the same as those of the first embodiment.

In the CMP using the above slurry, Cu 6 is precipitated on the Cu interconnection 4 by the phosphoric acid and filled in the scratch on the Cu interconnection 4, as illustrated in FIG. 2B. The Cu 6 is also formed on the Cu interconnection 4 outside the scratch to form a projection. The precipitation of Cu 6 is done by reducing Cu ions, which are dissolved in a solution by the CMP, by the phosphoric acid.

If such a projection is formed by the Cu 6, the Cu 6 outside the scratch is removed by the CMP process due to the CMP characteristic that the polishing rate of the projection is high (load dependence). As shown in FIG. 2C, the Cu 6 selectively remains in the scratch and the surfaces of the interlayer insulation film 2, TaN film 3 and Cu film 4 become flat.

The scratches of the test sample so obtained were observed by the defect inspection apparatus (produced by KLA-Tencor). It was confirmed that the number of scratches made on the Cu interconnection was conventionally 15,742 pcs. per 8-inch wafer and drastically reduced to 52 pcs. therefrom. It was also confirmed that the yield of interconnection per 8-inch wafer was 7% improved from 85% to 92%.

In the second embodiment, phosphoric acid (acid containing no conductive material) is used as a raw material of a restoring component; however, salt containing conductive material such as copper sulfate and copper chloride can be used. In this case, the conductive material included in the above salt previously added to slurry as well as that dissolved in the slurry by CMP is precipitated to reduce the scratches.

(Third Embodiment)

Figure 3A:
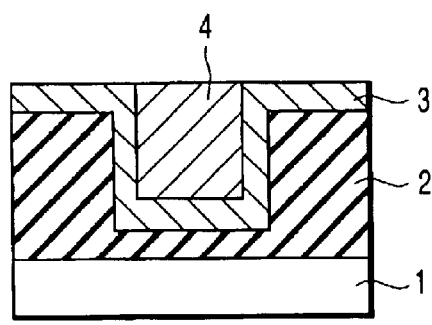
FIGS. 3A to 3C are step-by-step cross-sectional views showing a process of manufacturing a semiconductor device according to a third embodiment of the present invention.
Figure 3B:
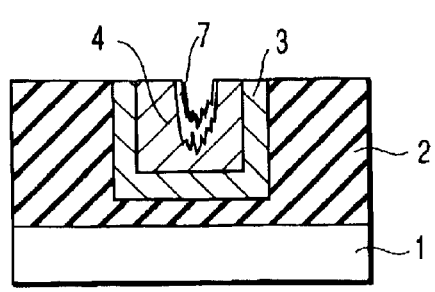
Figure 3C:
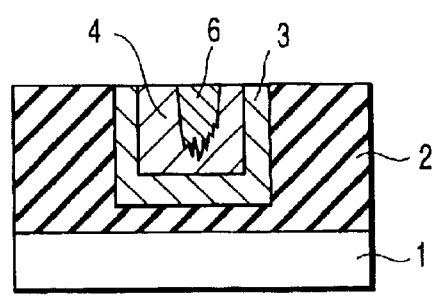

FIGS. 3A to 3C are step-by-step cross-sectional views showing a process of manufacturing a semiconductor device according to a third embodiment of the present invention. The third embodiment differs from the second embodiment in that the adhesion of a restoring component into a scratch is promoted to selectively fill Cu in the scratch.

First, the steps (first polishing) shown in FIGS. 1A to 1C of the first embodiment are performed to obtain the structure illustrated in FIG. 3A.

Then, the second polishing is performed. In the second polishing, dispersion water containing 0.03 wt % phosphoric acid of inorganic-acid as a reducing agent (restoring component of Cu interconnection 4), 0.01 wt % mercaptopropyl sulfonic acid as a promoter for causing a restoring component to adhere to a scratch, 1 wt % silica (diameter of primary particle=50 nm) as a polishing particle (polishing component), and 0.05 wt % 7-hydroxy-5-methyl-1,3,4-triazaindolizine as an additive, is used as slurry. The polishing conditions are the same as those of the first embodiment.

In the CMP using the above slurry, phosphorus acid 7 selectively adheres to the inner surface of a scratch caused on the Cu interconnection 4 by the promoter of mercaptopropyl sulfonic acid, as illustrated in FIG. 3B.

If the phosphorus acid 7 selectively adheres to the inner surface of the scratch, Cu 6 is selectively precipitated and filled in the scratch, as illustrated in FIG. 3C.

The scratches of the test sample so obtained were observed by the defect inspection apparatus (produced by KLA-Tencor). It was confirmed that the number of scratches made on the interlayer insulation film and Cu interconnection was conventionally 15,742 pcs. per 8-inch wafer and drastically reduced to 15 pcs. therefrom. It was also confirmed that the yield of interconnection per 8-inch wafer was 11% improved from 85% to 96%.

The third embodiment is directed to the restoration of a metal interconnection. A method of manufacturing a semiconductor device using slurry further including a promoter to promote the adhesion of a restoring component can be applied to the restoration of an insulation film by selecting a suitable promoter.

(Fourth Embodiment)

Figure 4A:
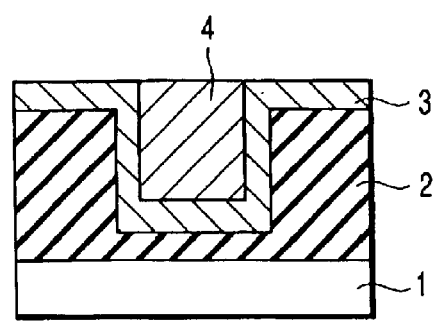
FIGS. 4A to 4C are step-by-step cross-sectional views showing a process of manufacturing a semiconductor device according to a fourth embodiment of the present invention.
Figure 4B:
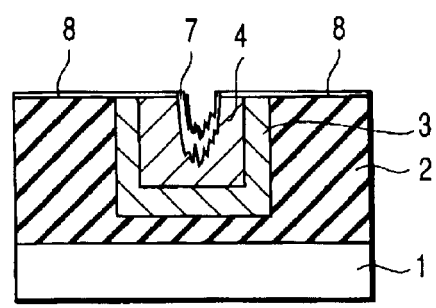
Figure 4C:
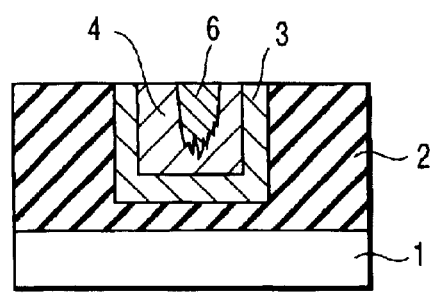

FIGS. 4A to 4C are step-by-step cross-sectional views showing a process of manufacturing a semiconductor device according to a fourth embodiment of the present invention. The fourth embodiment differs from the second embodiment in that the adhesion of a restoring component onto a region outside a scratch is retarded to selectively fill Cu in the scratch.

First, the steps (first polishing) shown in FIGS. 1A to 1C of the first embodiment are performed to obtain the structure illustrated in FIG. 4A.

Then, the second polishing is performed. In the second polishing, dispersion water containing 0.08 wt % phosphoric acid of inorganic-acid as a reducing agent (restoring component of Cu interconnection 4), 0.15 wt % polyethylene glycol as a retardant for retarding the adhesion of a restoring component onto a region outside a scratch, 1 wt % silica (diameter of primary particle=50 nm) as a polishing particle (polishing component), and 0.05 wt % 7-hydroxy-5-methyl-1,3,4-triazaindolizine as an additive, is used as slurry. The polishing conditions are the same as those of the first embodiment.

In the CMP using the above slurry, the surface of the region outside the scratch is covered with polyethylene glycol 8 and phosphorus acid 7 selectively adheres to the inner surface of the scratch, as shown in FIG. 4B. This is because the polyethylene glycol 8 has difficulty in going into the pores of the surface and selectively adheres to the flat portion of the surface. Since polyethylene glycol is continuously supplied from slurry to the surface of the region outside the scratch, the polyethylene glycol 8 is not eliminated from the surface of the region outside the scratch during the CMP.

In this state, Cu 6 is selectively precipitated and filled in the scratch, as illustrated in FIG. 4C.

The scratches of the test sample so obtained were observed by the defect inspection apparatus (produced by KLA-Tencor). It was confirmed that the number of scratches made on the Cu interconnection was conventionally 15,742 pcs. per 8-inch wafer and drastically reduced to 22 pcs. therefrom. It was also confirmed that the yield of interconnection per 8-inch wafer was 9% improved from 85% to 94%.

The fourth embodiment is directed to the restoration of a metal interconnection. A method of manufacturing a semiconductor device using slurry further containing a retardant for retarding the adhesion of a restoring component can be applied to the restoration of an insulation film by selecting a suitable retardant.

(Fifth Embodiment)

Figure 5A:
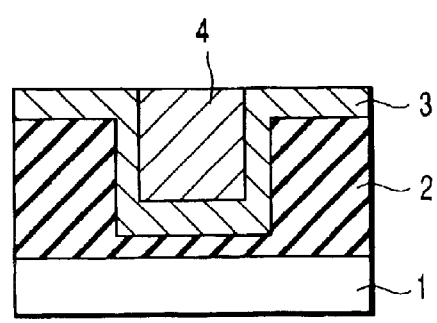
FIGS. 5A and 5B are step-by-step cross-sectional views showing a process of manufacturing a semiconductor device according to a fifth embodiment of the present invention.
Figure 5B:
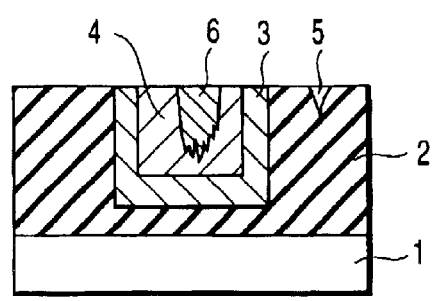

FIGS. 5A and 5B are step-by-step cross-sectional views showing a process of manufacturing a semiconductor device according to a fifth embodiment of the present invention.

The fifth embodiment is directed to a CMP process to reduce scratches caused on a Cu interconnection and an interlayer insulation film.

First, the steps (first polishing) shown in FIGS. 1A to 1C of the first embodiment are performed to obtain the structure illustrated in FIG. 5A.

Then, the second polishing is performed. In the second polishing, dispersion water containing 1 wt % hydrophobic silica particles the surfaces of which adsorb dodecylammonium as restoring components of the interlayer insulation film 2, 0.08 wt % phosphoric acid of inorganic-acid as a reducing agent (restoring component of Cu interconnection 4), 3 wt % silica (diameter of primary particle=30 nm) as a polishing particle (polishing component), and 0.05 wt % 7-hydroxy-5-methyl-1,3,4-triazaindolizine as an additive, is used as slurry.

Using the above slurry, as shown in FIG. 5B, the scratch on the interlayer insulation film 2 is reduced as in the first embodiment and that on the Cu interconnection 4 is done as in the second embodiment. It was confirmed that the scratches of the test sample so obtained were drastically reduced and the yield of interconnection was improved.

The present invention is not limited to the foregoing embodiments. Aluminum (Al) and tungsten (W) as well as Cu can be used for interconnection material, and nitride as well as oxide ($SiO_2$) can be used for insulative material. The substrate can be made of an SOI substrate. At least part of the substrate can be formed of SiGe. The present invention can be applied to a CMP process in a dual damascene process.

According to the present invention described above in detail, there can be provided CMP slurry capable of virtually reducing scratches during the CMP and a method of manufacturing a semiconductor device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:

forming an insulation film having a recess above a semiconductor substrate;

depositing a conductive film on the insulation film and filling the conductive film in the recess; and polishing the conductive film by a CMP process using CMP slurry in order to selectively leave the conductive film in the recess, the CMP slurry comprising a polishing component and a restoring component to reduce a scratch formed on at least one of the insulation film and the conductive film by causing the scratch to be filled.

2. The method according to claim 1, wherein the polishing includes reducing a scratch caused on the conductive film by precipitating a constituent element of the conductive film dissolved in the CMP slurry on the scratch owing to the restoring component in the CMP slurry.

3. The method according to claim 2, wherein the reducing is performed using both the restoring component and a promoter which causes the restoring component to adhere to an inner wall of the scratch.

4. The method according to claim 2, wherein the reducing includes selectively coating a region outside the scratch with a retardant which retards the restoring component from adhering to the region.

5. A method of manufacturing a semiconductor device, comprising:

forming an insulation film having an interconnection groove above a semiconductor substrate;

depositing a first conductive film on the insulation film and covering an inner wall of the interconnection groove with the first conductive film;

depositing a second conductive film on the first conductive film and filling the second conductive film in the interconnection groove;

retreating the second conductive film until the first conductive film is exposed to selectively leave the second conductive film in the interconnection groove; and polishing the first conductive film by a CMP process using CMP slurry in order to selectively leave the first conductive film and the second conductive film in the interconnection groove, the CMP slurry comprising a polishing component and a restoring component to reduce a scratch formed on at least one of the insulation film and the second conductive film by causing the scratch to be filled.

6. The method according to claim 5, wherein the polishing includes reducing a scratch caused on the second conductive film by precipitating a constituent element of the second conductive film dissolved in the CMP slurry on the scratch owing to the restoring component in the CMP slurry.

7. The method according to claim 6, wherein the reducing is performed using both the restoring component and a promoter which causes the restoring component to adhere to an inner wall of the scratch.

8. The method according to claim 6, wherein the reducing includes selectively coating a region outside the scratch with a retardant which retards the restoring component from adhering to the region.

* * * * *

UNITED STATES PATENT AND TRADEMARK OFFICE
CERTIFICATE OF CORRECTION

PATENT NO.    : 6,790,769 B2
DATED         : September 14, 2004
INVENTOR(S)   : Kurashima et al.

It is certified that error appears in the above-identified patent and that said Letters Patent is hereby corrected as shown below:

Title page,
Item [57], ABSTRACT,
Line 4, change "and filming conductive" to -- and filling the conductive --.

Signed and Sealed this

Twenty-first Day of December, 2004

JON W. DUDAS
*Director of the United States Patent and Trademark Office*